United States Patent
Lee et al.

(10) Patent No.: US 6,356,099 B1
(45) Date of Patent: Mar. 12, 2002

(54) TRANSMISSION-LINE-NOISE IMMUNE INPUT BUFFER

(75) Inventors: Dennis Lee, San Jose; Mark William Knecht, Los Gatos; Kalaine Mak Wong; Oikwan Tsang, both of San Jose, all of CA (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 08/337,636

(22) Filed: Nov. 10, 1994

(51) Int. Cl.$^7$ .......................... H03K 17/16; H03K 3/13
(52) U.S. Cl. .......................... 326/24; 326/83; 327/206
(58) Field of Search .......................... 326/24, 83, 121; 327/206

(56) References Cited

U.S. PATENT DOCUMENTS

| 3,984,703 A | * | 10/1976 | Jorgensen | 327/206 |
| 4,465,587 A | * | 8/1984 | Suzuki | 327/206 |
| 4,563,594 A | * | 1/1986 | Koyama | 327/206 |
| 4,682,055 A | * | 7/1987 | Upadhyayula | 326/31 |
| 5,175,445 A | * | 12/1992 | Kinugash | 326/121 |
| 5,341,033 A | * | 8/1994 | Koker | 327/206 |
| 5,349,246 A | * | 9/1994 | McClure | 326/121 |

FOREIGN PATENT DOCUMENTS

EP  AO 467 352  1/1992

OTHER PUBLICATIONS

Glasser and Dobberpuhl, "The Design and Analysis of VLSP Circuits,"pp. 281–282, (1985).

Bundalo, Z.V., et al., "Three–state CMOS Schmitt Triggers," *International Journal of Electronics*, vol. 66, No. 1, pp. 81–92, 1989.

Pfister, A., "Novel CMOS Schmitt Trigger with Controllable Hysteresis,"*Electronic Letters*, vol. 28, No. 7, pp. 639–641, 1992.

Filanovsky, I.M., et al., "CMOS Schmitt Trigger Design," *IEEE Transactions on Circuits and Systems*, vol. 41, No. 1, pp. 46–49, 1994.

Fifield, J.A., et al., "CMOS Push–Pull Dynamic Schmitt Trigger Circuit," *IBM TDB*, vol. 25, No. 4, pp. 1822–1823, 1982.

* cited by examiner

Primary Examiner—Michael Tokar
Assistant Examiner—James H. Cho
(74) Attorney, Agent, or Firm—Williams, Morgan & Amerson, P.C.

(57) ABSTRACT

An input buffer for an integrated circuit and providing reduced sensitivity to input noise present in a transmission line environment. This input buffer deskews an input signal where the rise time is much slower than the fall time, such as that from an open-collector output driver, so that the rising edge propagation delay and falling edge propagation delay of the input buffer are approximately equal.

21 Claims, 2 Drawing Sheets

Ta~Tb

TRANSMISSION-LINE-NOISE IMMUNE INPUT BUFFER

BACKGROUND OF THE INVENTION

This invention relates to the field of integrated circuits, and more particularly to an input buffer for digital integrated circuits used in environments where signal noise is common.

Integrated circuits are widely used in applications involving computers, networks, and their related peripherals, such as disk drives, CD-ROM drives, printers, scanners, and modems. The number of installed computers continues to increase as well as the number and types of peripheral devices.

Peripheral devices must interface with a computer in order for the them to communicate and transfer information. Connections between computers and their related peripherals are frequently made using cables because, among other reasons, the cost of cable connections is relatively inexpensive. Moreover, long cable runs are often used because it is usually impractical to have a computer and its related peripherals in close proximity to another.

In contrast, on printed circuit boards, integrated circuits and other components are a short distance from one another and relatively short metal traces connect the different components. These metal traces generally exhibit good signal quality as compared to long cable runs which usually have a much noisier signal quality. Noise is introduced into the environment from the cable itself, the connectors and terminators of a cable, reflections from cable terminations, noisy or faulty integrated circuits, as well as many other sources.

Noise is inherent and causes problems because integrated circuits may interpret the noise as a valid logic level and pass this incorrect information on to other circuitry on the same integrated circuit or to other integrated circuits in the digital system. In the past, device manufacturers have emphasized solving this problem by slowing an edge rate at an output of an integrated circuit to reduce the introduction of noise into the environment. However, this only addresses one source of the noise and does not solve the problem completely. Other sources, such as noise from the cables themselves or reflections within the cables still contribute a great deal of noise and cause communication problems. Furthermore, in order to function reliably, a system must not only reduce transmission-line noise at an output, but must also be able to deal with unfiltered noise when receiving data at an input because noise reflections are present on both transmitting and receiving phases.

Another problem is that integrated circuits used in a computer or network environment generally have an input skew, a significantly slower rising edge time than falling edge time. This skew is especially pronounced when open-drain output drivers are used because a pull-up of the rising edge is accomplished using a resistor. This is a problem for integrated circuits because unless the skew is corrected, the propagation delay through an entire integrated circuit will also be significantly skewed, which is undesirable.

Typically, inverting buffers are used for the input stage of an integrated circuit, but these propagate most types of noise occurring at an input pad of the input stage through to the internal circuitry of the integrated circuit. An input stage having inverting buffers has only very slight noise immunity. Furthermore, inverting buffers are limited in their ability to correct input skew.

Schmitt trigger circuits also have been used in the industry. Used in the input stage, a Schmitt trigger circuit has more noise immunity than a simple inverting buffer input stage, but nevertheless, this noise immunity remains similarly limited. Furthermore, a Schmitt trigger, like inverting buffers, does not address the input skew problem.

As the number of computer and network related installations and applications and peripherals continues to increase, a demand for digital integrated circuits increases. Hence, there is a need to implement better techniques in the design of digital integrated circuits to deal with the noise and input skews present in these environments.

SUMMARY OF THE INVENTION

The present invention includes an input buffer for an integrated circuit and provides reduced sensitivity to the input noise present in a transmission line environment. The input buffer of the preferred embodiment also deskews an input signal having a rise time that is much slower than a fall time, such as that from an open-collector output driver, so that a rising edge propagation delay and a falling edge propagation delay of the input buffer are approximately equal.

In particular, the present invention is an input buffer for an integrated circuit for receiving an input signal from a passive pull-up output driver, the input signal having a rise time slower than a fall time, including: a Schmitt trigger having (1) an input, coupled to an input pad of the integrated circuit, for receiving the input signal, (2) a pull-up driver, coupled to the input, having a first drive capability due to a first gate size, and (3) a pull-down driver, coupled to the input, having a second drive capability due to a second gate size, wherein the second gate size is from five to fifteen times greater than the first gate size. Further, the output of the Schmitt trigger is coupled to a buffer having an input gate size from five to fifteen times greater than the first gate size of the Schmitt trigger.

Further features of the invention, its nature and various advantages will become more apparent from the accompanying drawings and following detailed description of the preferred embodiments.

DESCRIPTION OF THE PREFERRED EMBODIMENT

Figure 1:
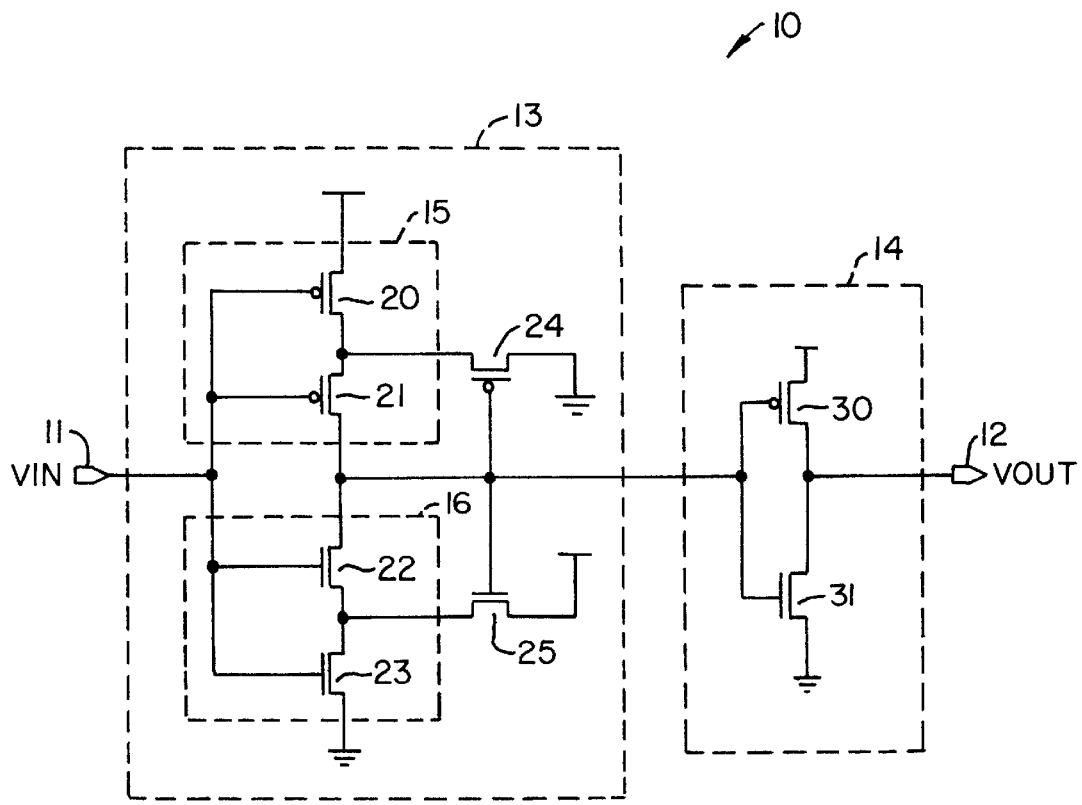
FIG. 1 is a circuit diagram of the input buffer of the present invention.

FIG. 1 is a circuit diagram of a transmission line noise immune input buffer 10 according to the present invention. Input buffer 10 includes an input VIN 11 and an output VOUT 12. VIN 11 is typically an input of an integrated circuit receiving an input signal. VOUT 12 is an output of input buffer 10 and transfers the input signal into other circuitry on the same integrated circuit as that of input buffer 10. Input buffer 10 includes two stages: a Schmitt trigger 13, which is connected to VIN 11, and a buffer 14 connected between an output of Schmitt trigger 13 and VOUT 12.

In the preferred embodiment, the Schmitt trigger 13 is fabricated using CMOS technology. However, those skilled in the art will realize that there are many other configurations for Schmitt trigger circuits, and it is possible to use other technologies such as bipolar or NMOS processes. Schmitt trigger 13 includes a pull-up driver 15 and a pull-down driver 16. Pull-up driver 15 includes two PMOS transistors (20 and 21), which are connected in series. A source of PMOS transistor 20 is connected to a first voltage reference, (typically VCC that is about equal to 5 volts). A drain of PMOS transistor 20 is connected to a source of PMOS transistor 21. A drain of PMOS transistor 21 is connected to the output of Schmitt trigger 13. A gate of PMOS transistor 20 and PMOS transistor 21 is connected to VIN 11. Pull-up driver 15 pulls up a voltage level at the output of Schmitt trigger 13 when the input signal at VIN 11 goes low.

Schmitt trigger 13 includes a pull-down driver 16, having two NMOS transistors (22 and 23) connected in series to a second voltage reference, typically VSS that is about equal to zero volts). A drain of NMOS transistor 22 is connected to the output of Schmitt trigger 13. A source of NMOS transistor 22 is connected to a drain of NMOS transistor 23, a source of NMOS transistor 23 is connected to the second voltage reference. A gate of NMOS transistor 22 and NMOS transistor 23 are connected to VIN 11. Pull-down driver 16 pulls the voltage level at the output of the Schmitt trigger low when the input signal at VIN 11 goes high.

Schmitt trigger 13 includes two other transistors, a PMOS transistor 24 and an NMOS transistor 25. A source of PMOS transistor 24 is connected to the second voltage reference, a drain of PMOS transistor 24 is connected to the drain of PMOS transistor 20 and a gate of PMOS transistor 24 is connected to the output of Schmitt trigger 13. The source of NMOS transistor 25 is connected to the first voltage reference, while the drain is connected to the junction of NMOS transistors 22 and 23 and the gate is connected to the output of Schmitt trigger 13.

PMOS transistor 24 and PMOS transistor 25 are feedback transistors used to obtain a hysteresis that is characteristic of a Schmitt trigger. In particular, a Schmitt trigger has two distinct switching points: a VIH, a trigger voltage for a low-to-high going input, and a VIL, a trigger voltage for a high-to-low going voltage. VIH is at a voltage level higher than VIL. Because of this hysteresis, Schmitt triggers do give some noise immunity, but not much more than a normal buffer.

When designing MOS transistors, a size of each device is important, especially as a measure of current sourcing capability. Specific device sizing often depends on a specific integrated circuit process technology used to make the transistors. In many processes, an NMOS transistor is able to source about the same amount of current as a PMOS transistor twice the size. A size of a transistor typically refers to a width and length of its gate. Accordingly, typical sizes for transistors in a Schmitt trigger of the prior art have PMOS transistors in a pull-up driver being twice as large as the NMOS transistors in a pull-down driver, so that the pull-up driver will have a pull-up current drive capability approximately equal the pull-down current capability of the pull-down driver. Transistor 24 and transistor 25 are sized to set the VIL and VIH, providing an amount of hysteresis and trigger-voltage levels appropriate for the particular application.

In a preferred embodiment of the present invention, however, the size of the transistors in pull-down driver 16 is much larger (preferably from about five to fifteen times larger) than the size of the transistors in the pull-up driver 15. In the most preferred embodiment for the present process the transistors in pull-down driver 16 are about ten times larger than transistors in pull-up driver 15. For example, assuming the size of both PMOS transistor 20 and PMOS transistor 21 to be 6/1.3, where 6 is the channel width and 1.3 is the channel length, the size of both NMOS transistor 22 and NMOS transistor 23 is approximately 60/1.3.

Buffer 14 has an input connected to the output of Schmitt trigger 13. An output of buffer 14 is connected to VOUT 12. In the preferred embodiment, buffer 14 is implemented as a CMOS inverter having a PMOS transistor 30 pull-up transistor and an NMOS transistor 31 pull-down transistor. A source of PMOS transistor 30 is connected to the first voltage reference and a drain of PMOS transistor 30 is connected to a drain of NMOS transistor 31. A source of NMOS transistor 31 is connected to the second voltage reference. A gate of PMOS transistor 30 and NMOS transistor 31 is connected to the output of Schmitt trigger 13.

For the reasons discussed above, to give an approximately equal pull-up and pull-down current capability, a typical size for a prior art inverter in CMOS technology provides for a pull-up transistor to be about twice as large as a pull-down transistor.

In the preferred embodiment of the present invention, however, NMOS transistor 31 is much larger (preferably from about five to fifteen times larger) in gate size than the gate sizes of the transistors in pull-up driver 15 of Schmitt trigger 13. In a more preferred embodiment, a size of NMOS transistor 31 is about ten times larger than the size of the transistors of pull-up driver 15. For example, when the size of PMOS transistor 20 and PMOS transistor 21 is 6/1.3, the preferred size of NMOS transistor 31 is approximately 60/1.3.

In operation, input buffer 10 receives an input signal at VIN 11, typically from an input pad of an integrated circuit embodying the invention. In this embodiment, input buffer 10 passes this input signal through Schmitt trigger 13 and buffer 14 to produce a noninverted signal output at VOUT 12. Input buffer 10 drives the internal logic and circuitry of this integrated circuit.

Figure 2:
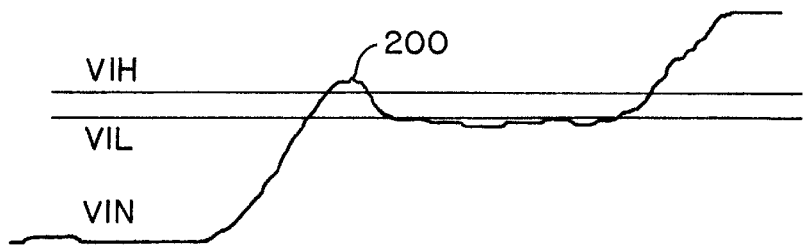
FIG. 2 is a timing diagram illustrating a typical low-to-high input transition in a noisy transmission line environment.

The present invention is especially appropriate for use in a transmission line environment where input signals are not ideal square waves, but rather unclean, glitchy, and noisy signals. FIG. 2 is a timing diagram illustrating a typical noisy signal for a low-to-high transition in a transmission line environment. There are two horizontal lines indicating VIL and VIH, the trigger voltages of Schmitt trigger 13. On an low-to-high going input, for Schmitt trigger 13 to switch, the input voltage must exceed the VIH value. Also illustrated is a noise "glitch" 200 that occurs about midway between the switch from low-to-high.

Figure 3:
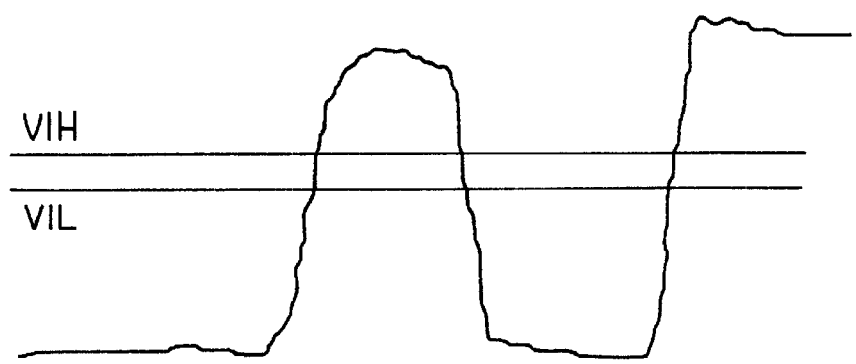
FIG. 3 is a timing diagram illustrating the output response of a typical input buffer to the noisy input signal shown in FIG. 2.

FIG. 3 is a timing diagram illustrating an output of an input buffer having a conventional Schmitt trigger. Such a conventional input buffer has two pulses on the output. The first pulse is false data. Since the two pulses feed directly into the internal circuitry of the integrated circuit, this false data may make the integrated circuit go into an unwanted functional state or create logic problems for other integrated circuits on the same circuit board.

Figure 4:
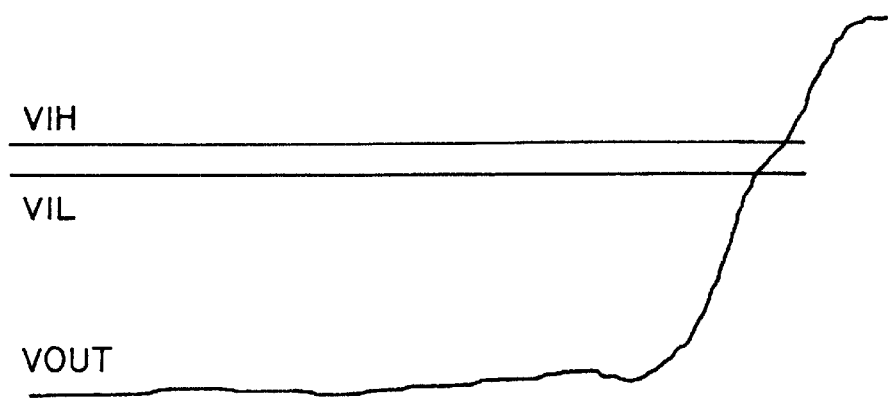
FIG. 4 is a timing diagram illustrating the output from the input buffer of the present invention in response to the noisy input signal shown in FIG. 2.

FIG. 4 is a timing diagram illustrating an output response, at VOUT 12, for input buffer 10 when receiving the waveform of FIG. 2 at VIN 11. The output response at VOUT 12 is a relatively clean low-to-high transition, with noise glitch 200 in FIG. 2 having no appreciable effect on the output. Input buffer 10 thus includes a noise filtering capability. This noise filtering capability is due to the hysteresis of Schmitt trigger 13, Schmitt trigger 13 device sizing, and the unusual sizing of NMOS transistor 31 so that it is from five to fifteen times larger than the gate sizes of the pull-up driver 15 to provide a heavy capacitive load at the output of Schmitt trigger 13. Input buffer 10 has superior noise filtering capability for use in a transmission line environment.

Figure 5:
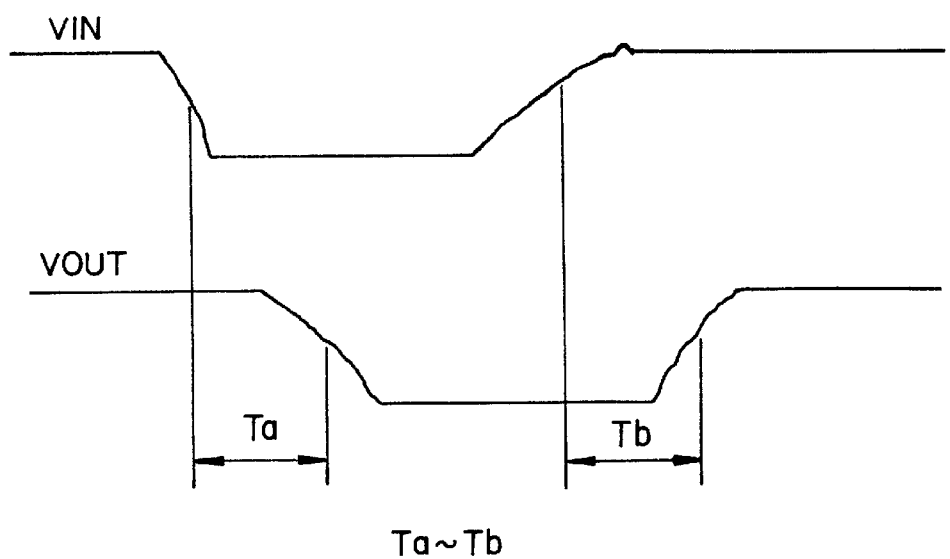
FIG. 5 is a timing diagram illustrating a timing diagram where VIN is the typical output signal from of a open-collector output driver and VOUT is the deskewed output response of the input buffer of the present invention.

FIG. 5 is a timing diagram illustrating another feature of the present invention. In a transmission line environment, the output drivers of many integrated circuits are typically open collector, meaning that designs typically use resistive or passive pull-up circuits that are relatively slow, particularly when compared to active pull-down circuits. Consequently, for a passive pull-up type of output driver, the low-to-high transition of an output signal is much slower than a high-to-low transition. This skew can be substantial and is passed on to an input of the next integrated circuit shown in FIG. 5.

The response of a conventional input buffer to the VIN waveform shown in FIG. 5 is that the VOUT is also skewed similarly so that the low-to-high transition is also much slower than the high-to-low. This substantial skew in VOUT is undesirable because the skew will generally pass through the entire integrated circuit so that the output waveform of the integrated circuit is also skewed. This skew can cause possible timing problems for other integrated circuits.

Input buffer 10 corrects skewed input signals such as the VIN waveform in FIG. 5 so that the VOUT propagation delay for high-to-low and low-to-high edges are approximately equal. As shown in FIG. 5, when VIN goes high-to-low, VOUT also goes high-to-low, and when VIN goes low-to-high, VOUT also goes low-to-high. FIG. 5 also shows that for the preferred embodiment, the propagation delay for VOUT going high-to-low (i.e., Ta) is approximately equal to the propagation delay of VOUT going low-to-high (i.e., Tb).

Furthermore, in the preferred embodiment, the data settling time in response to a rising edge signal is about equal to that for a falling edge signal, which means that the time skew between the fastest and slowest data from a bus is at a minimum regardless of the input data. In particular, data at the output of an input buffer of the present invention are settled in relatively the same period of time regardless of the direction in which the input data switches. Consequently, the present invention expands the periods of valid data and increases hold time.

The deskewing ability of the present invention results from the sizing of Schmitt trigger 13 where the ratio of the sizes for the NMOS pull-down transistors 15 are approximately five to fifteen times larger than the PMOS pull-up transistors 16 and also from the capacitance loading from buffer 14 on the output of Schmitt trigger 13, The capacitive loading enhances the deskewing characteristic of Schmitt trigger 13 by delaying the high-to-low transition of Schmitt trigger 13.

It will be understood that the foregoing is merely illustrative of the principles of this invention and that various modifications can be made by those skilled in the art without departing from the scope and spirit of the invention.

For example, buffer 14 can be substituted with other circuitry that operates and functions as the present invention. Moreover, the noise-suppressing effect of the circuitry may be increased by adding some resistance between the output of Schmitt trigger 13 and the input of buffer 14. Other such modifications will become apparent to those skilled in the art.

What is claimed is:

1. An input buffer for an integrated circuit for receiving an input signal from a passive pull-up output driver, the input signal having a rise time slower than a fall time, comprising:
   a Schmitt trigger comprising:
      an input, coupled to an input pad of the integrated circuit, for receiving the input signal;
      a pull-up driver, coupled to said input, having a first drive capability due to a first gate size; and
      a pull-down driver, coupled to said input, having a second drive capability due to a second gate size, wherein said second gate size is greater than said first gate size; and
   a buffer, coupled to an output of said Schmitt trigger and having a first input gate size of a pull-down device of said buffer that is at least five times greater than said first gate size.

2. The input buffer of claim 1 wherein a rising edge propagation delay at an output of said buffer is approximately equal to a falling edge propagation delay at said output of said buffer.

3. The input buffer of claim 1 wherein a ratio of said first input gate size divided by said first gate size to a second input gate size of a pull-up device of said buffer divided by said second gate size is at least five.

4. The input buffer of claim 3 wherein a rising edge propagation delay at an output of said buffer is approximately equal to a falling edge propagation delay at said output of said buffer.

5. The input buffer of claim 3 wherein said ratio is less than fifteen.

6. The input buffer of claim 1 wherein said first input gate size is less than fifteen times greater than said first gate size.

7. The input buffer of claim 1 wherein a ratio of said first input rate size divided by said first gate size to a second input gate size of a pull-up device of said buffer divided by said second gate size is about ten.

8. The input buffer of claim 1 wherein said first input gate size of said buffer is about ten times greater than said first gate size.

9. The input buffer of claim 1 wherein said buffer is a CMOS inverter.

10. An input buffer for an integrated circuit for receiving an input signal from a passive pull-up output driver, the input signal having a rise time slower than a fall time, comprising:
    a Schmitt trigger comprising:
       an input, coupled to an input pad of the integrated circuit, for receiving the input signal;
       a pull-up driver, coupled to said input, having a first drive capability due to a first gate size; and
       a pull-down driver, coupled to said input, having a second drive capability due to a second gate size;
    a buffer, coupled to an output of said Schmitt trigger and having a first input gate size of a pull-down device of said buffer that is greater than said first gate size; and
       wherein a ratio of said first input gate size divided by said first gate size to a second input gate size of a pull-up device of said buffer divided by said second gate size is at least five.

11. The input buffer of claim 10 wherein said first input gate size of said buffer is at least five times greater than said first gate size.

12. An input buffer for an integrated circuit for receiving an input signal from a passive pull-up output driver, the input signal having a rise time slower than a fall time, comprising:

a first MOS transistor having a drain, a gate, a source, and a gate size, wherein said source is coupled to a first supply voltage;

a second MOS transistor having a drain, a gate, a source, and a gate size, wherein said source of said second MOS transistor is coupled to said drain of said first MOS transistor, said gate of said second MOS transistor is coupled to said gate of said first MOS transistor and an input pad of the integrated circuit;

a third MOS transistor having a drain, a gate, and a source, wherein said drain of said third MOS transistor is coupled to said source of said second MOS transistor, said gate of said third MOS transistor is coupled to said drain of said second MOS transistor, said source of said third MOS transistor is coupled to a second supply voltage;

a fourth MOS transistor having a drain, a gate, a source, and a gate size, wherein said drain of said fourth MOS transistor is coupled to said drain of said second MOS transistor, said gate of said fourth MOS transistor is coupled to said gate of said first MOS transistor;

a fifth MOS transistor having a drain, a gate, a source, and a gate size, wherein said drain of said fifth MOS transistor is coupled to said source of said fourth MOS transistor, said gate of said fifth MOS transistor is coupled to said gate of said first MOS transistor, said source of said fifth MOS transistor coupled to said second supply voltage;

a sixth MOS transistor having a drain, a gate, and a source, wherein said drain of said sixth MOS transistor is coupled to said first supply voltage, said gate of said sixth MOS transistor is coupled to said drain of said second MOS transistor, said source of said sixth MOS transistor is coupled to said source of said fourth MOS transistor;

a buffer, having an input and an output, wherein said input is coupled to said drain of said second MOS transistor and said buffer has a first input gate size of a pull-down device of said buffer that is at least five times greater than said gate sizes of said first and second MOS transistors; and wherein a ratio of said first input gate size divided by said gate sizes of said first and second MOS transistors to a second input gate size of a pull-up device of said buffer divided by said gate sizes of said fourth and fifth MOS transistors is at least five.

13. The input buffer of claim 12 wherein a rising edge propagation delay at said output of said buffer is approximately equal to a falling edge propagation delay at said output of said buffer.

14. The input buffer of claim 12 wherein said first, second, and third transistors are PMOS transistors.

15. The input buffer of claim 12 wherein said fourth, fifth, and sixth transistors are NMOS transistors.

16. The input buffer of claim 14 wherein said fourth, fifth, and sixth transistors are NMOS transistors.

17. The input buffer of claim 12 wherein said first supply voltage is VCC and said second supply voltage is the ground.

18. The input buffer of claim 12 wherein said buffer is a CMOS inverter.

19. The input buffer of claim 12 wherein said ratio is less than fifteen.

20. The input buffer of claim 12 wherein said ratio is less than fifteen.

21. An input buffer for an integrated circuit for receiving an input signal from a passive pull-up output driver, the input signal having a rise time slower than a fall time, comprising:

a first PMOS transistor having a drain, a gate, a source, and a gate size, wherein said source is coupled to a first supply voltage;

a second PMOS transistor having a drain, a gate, a source, and a gate size, wherein said source of said second PMOS transistor is coupled to said drain of said first PMOS transistor, said gate of said second PMOS transistor is coupled to said gate of said first PMOS transistor and an input pad of the integrated circuit;

a third PMOS transistor having a drain, a gate, and a source, wherein said drain of said third PMOS transistor is coupled to said source of said second PMOS transistor, said gate of said third PMOS transistor is coupled to said drain of said second PMOS transistor, said source of said third PMOS transistor is coupled to a second supply voltage;

a first NMOS transistor having a drain, a gate, a source, and a gate size, wherein said drain of said first NMOS, transistor is coupled to said drain of said second PMOS transistor, said gate of said first NMOS transistor is coupled to said gate of said first PMOS transistor;

a second NMOS transistor having a drain, a gate, a source, and a gate size, wherein said drain of said second NMOS transistor is coupled to said source of said first NMOS transistor, said gate of said second NMOS transistor is coupled to said gate of said first PMOS transistor, said source of said second NMOS transistor coupled to said second supply voltage;

a third NMOS transistor having a drain, a gate, and a source, wherein said drain of said third NMOS transistor is coupled to said first supply voltage, said gate of said third NMOS transistor is coupled to said drain of said second PMOS transistor, said source of said third NMOS transistor is coupled to said source of said first NMOS transistor;

a CMOS inverter, having an input and an output, wherein said input is coupled to said drain of said second PMOS transistor and said CMOS inverter has a first input gate size of a pull-down device that is about ten times greater than said gate sizes of said first and second PMOS transistors; and wherein a rising edge propagation delay at said output of said CMOS inverter is approximately equal to a falling edge propagation delay at said output of said CMOS inverter.

* * * * *